United States Patent [19]
Rasmussen

[11] Patent Number: 5,804,310
[45] Date of Patent: Sep. 8, 1998

[54] PATTERNED FIBERS

[76] Inventor: Glen L. Rasmussen, The Boeing Company P. O. Box 3707, M/S 13-08, Seattle, Wash. 98124-2207

[21] Appl. No.: 768,487

[22] Filed: Dec. 18, 1996

[51] Int. Cl.$^6$ .................................................. D06M 14/08
[52] U.S. Cl. ........................ 428/376; 430/314; 430/320; 442/320
[58] Field of Search ............................ 428/376; 430/314, 430/320; 442/320

[56] References Cited

U.S. PATENT DOCUMENTS

| | | |
|---|---|---|
| 4,215,988 | 8/1980 | Kohama et al. . |
| 4,218,217 | 8/1980 | Redd, Jr. . |
| 4,332,600 | 6/1982 | Wegerhoff et al. . |
| 4,332,601 | 6/1982 | Wegerhoff et al. . |
| 4,364,739 | 12/1982 | Tomibe et al. . |
| 4,374,893 | 2/1983 | Arsac et al. . |
| 4,428,761 | 1/1984 | Howard et al. . |
| 4,566,889 | 1/1986 | Schmadel, Jr. . |
| 4,661,376 | 4/1987 | Liang . |
| 4,759,986 | 7/1988 | Mariker et al. . |
| 4,892,626 | 1/1990 | Covey . |
| 5,089,325 | 2/1992 | Covey . |

OTHER PUBLICATIONS

White, et al., "Effective Medium Analysis of the Dielectric Constant in Dielectric Media Containing Short Conductive Fibers" Sep. 10, 1985.

Okamoto, et al., Japanese Journal of Applied Physics, "Electrical Conduction and Phase Transition of Copper Sulfides," vol. 12, No. 8, Aug. 1973, pp. 1130–1138.

Hathaway, et al., "The Electronic Properties and Crystal Structure of $Na_4Cu(NH_3)_4-[Cu(S_2O_3)_2]_2L(L=H_2O$ or $NH_3)$," J. Chem. Soc. (A), 1970, pp. 884–888 Sep. 3, (1969).

Soriano, et al., "On the Photoconductivity of Copper Sulphide Polycrystalline Thin Films," Solar Energy Materials 12 (1985) pp. 149–155, Jan. 3.

*Primary Examiner*—Johann Richter
*Assistant Examiner*—Taofiq A. Solola
*Attorney, Agent, or Firm*—John C. Hammar

[57] ABSTRACT

Patterned fibers having repeating segments of controlled conductivity separated by insulating segments are prepared by patterning the fiber with photoresist and, optionally, metallizing bare portions of the fiber where the photoresist has been exposed and removed. Fibers of the present invention can be patterned as alternating segments of bare fiber/photoresist-coated fiber, bare fiber/metallized fiber, or metallized fiber/photoresist-coated fiber.

13 Claims, No Drawings

PATTERNED FIBERS

TECHNICAL FIELD

The present invention relates to patterned fibers, especially PAN carbon fibers, and their method of manufacture.

BACKGROUND OF THE INVENTION

There continues to be a need to make composite materials of controlled conductivity. For example, it has been common to use a mat of carbon fibers as a facing layer on composite skins. U.S. Reissue Patent 34,162 describes a mat made with partially carbonized PAN fibers. The present invention relates to another way to obtain mats of controlled conductivity.

SUMMARY OF THE INVENTION

Patterned fibers, especially PAN carbon fibers, have alternating areas of treated (generally higher conductivity in the semiconductor or conductor regime) segments and untreated (generally lower condictivity or insulating) segments. Each segment has a known and controlled conductivity. In one embodiment the fibers have alternating segments of photoresist coated fiber and metallized fiber. Alternatively, the fiber might include alternating segments of an uncoated fiber and metallized fiber or uncoated fiber and photoresist coated fiber, as the conductivity requirements impose.

A continuous fiber can be chopped into short lengths of predetermined aspect ratio or simply can be patterned to include the desired aspect ratio for the higher conductivity segments and used in woven fabrics or unidirectional tows. Chopped fibers can be felted into mats of the type described in U.S. Reissue 34,162 to produce mats that have a predetermined, controlled conductivity.

DETAILED DESCRIPTION OF THE INVENTION

Patterned fibers are prepared by applying photoresist to selected regions for the continuous fiber, patterning the photoresist to produce a fiber having alternating segments of bare fiber and photoresist-coated fiber, and, optionally, depositing metal, especially copper, on the bare fiber segments. After apply the metal, the remaining photoresist might be exposed and removed. The pattern will provide segments of relatively higher conductivity having a predetermined aspect ratio (i.e., fiber segment length/fiber diameter) separated by generally insulating, untreated segments. The lengths of the treated segments can be uniform or can vary as desired along the length of the fiber. Similarly, the lengths of the treated segments and the untreated segments can be substanially equal or can vary, as the application may dictate. The fibers are useful as fiber reinforcement or fillers in organic resin matrix composites.

Preferred fibers are high strength, fully carbonized PAN carbon fibers or the like. The photoresist preferably is a liquid negative resist such as Union Carbide's KTI 752 which is sensitive to ultraviolet light and is strippable with SN-12 (Advanced Chemical Systems Int'l, Inc.) at 100° C. or Stoddard solvent at 20° C. The metal preferably is copper and is applied from a CuS solution to produce a complex with the PAN fiber or a surface coating. To make the patterned fibers, we apply resist to a thickness of about 0.1–0.4 mm. After evaporating the solvent from the resist for about 30 min at 100° C., we expose the resist to 500 mJ/cm$^2$ ultraviolet light before developing the resist with Stoddard solvent.

One method to make the dielectric polyacrylonitrile fibers electrically conducting involves heating the fibers in a solution containing cupric sulfate and hydroxylamine sulfate to reduce cupric ions to cuprous ions which are then absorbed within the fibers. The heat-treated fibers are rinsed with deionized water and then heated again in a separate solution containing sodium thiosulfate to precipitate the absorbed cuprous ions within the fibers to copper sulfide. Precipitation of the copper sulfide occurs exclusively on or in the polyacrylonitrile fibers and not in the solution. [The electrical conductivity of the fibers produced in the present invention can be varied over a range by varying the concentration of the solutions.] The electrically conductive fibers are stable and have excellent resistance to mechanical working. Other ways to obtain the desired conductivity for the treated segments includes metallizing the fibers by sputtering or, especially, electroless plating.

Polyacrylonitrile fibers have a strong affinity for cuprous ions, and this property has been exploited to dye fibers. The cuprous ions form coordinate bonds to the nitrile groups and then combine with the dyestuff molecule. To ensure good results, cupric ions are added to the dyebath as cupric sulfate and are reduced in situ to the cuprous form; the temperature must not be below 100° C., otherwise the rate of absorption by the fiber of cuprous ion and of dyestuff is slow. In the present invention, we use sodium thiosulfate in place of the dyestuff.

Following the process in U.S. Pat. No. 4,364,739, I substituted polyacrylonitrile fibers for modacrylic fibers in which the fibers were first heat treated in a 1 liter aqueous solution containing 20 grams of cupric sulfate and 10 grams of hydroxylamine sulfate at a temperature of 100° C. for 90 minutes having a pH of about 1.5–2.5. The fibers were then rinsed with deionized water and subjected to a second heat-treatment in a separate 1 liter aqueous solution containing 10 grams of sodium thiosulfate and 2 grams of sodium acetate at a temperature of 70°–100° C. for 60 minutes having a pH of about 5.0–6.0.

This CuS process limits the amount of fiber shrinkage during the CuS treatment by varying the molar ratio of cupric sulfate to hydroxylamine sulfate to protect the polyacrylonitrile fiber from over impregnation by the absorbing cuprous ions. The polyacrylonitrile fiber having absorbed the cuprous ions becomes yellowish in color. The fibers do not posses any higher electrical conductivity than carbon fiber at this point. If the cuprous ion content is too high, the fibers will shrink to an extent that renders the physical properties unsatisfactory. If the concentration of cuprous ion is too low, an inadequate electrical conductivity will result.

Electrical conductivity is imparted to the fibers in the second stage of the CuS process by precipitating the absorbed cuprous ions within the fibers with sodium thiosulfate to produce copper sulfide. The copper sulfide in covellite or chalcocite form imparts excellent electrical conductivity properties to the PAN fibers. The weight percentage of non-stoichiometric copper sulfide in the electrically conducting fiber is expressed in terms of weight of copper sulfide is about 12% based upon weight of starting fiber. The second stage preferably occurs at 100° C. for 90 minutes, followed by rinsing thoroughly with deionized water and drying.

While I have described preferred embodiments, those skilled in the art will readily recognize alterations, variations, and modifications which might be made without departing from the inventive concept. Therefore, interpret the claims liberally with the support of the full range of equivalents known to those of ordinary skill based upon this description. The examples are given to illustrate the invention and not intended to limit it. Accordingly, limit the claims only as necessary in view of the pertinent prior art.

I claim:

1. A patterned, elongated fiber having alternating segments of metallized areas and untreated areas extending in sequence along the length of the fiber, the metallized areas having a predetermined, relatively high conductivity in relation to the untreated areas and a predetermined aspect ratio, the untreated areas being bare fiber or photoresist coated fiber.

2. The patterned fiber of claim 1 wherein the fiber is a fiber derived from polyacrylonitrile.

3. A mat having a predetermined conductivity, comprising:

(a) felted, chopped carbon fibers of predetermined length, the fibers including predetermined, higher conductivity areas having a predetermined aspect ratio and having a predetermined and controlled conductivity in the range from about 1000–3000 mhos/m, the areas being formed by metallizing a continuous fiber in discrete, separate selected locations prior to chopping the fiber, the continuous fiber having segments of bare fiber or photoresist-coated fiber; and (b) a binder for adhering the chopped carbon fibers.

4. A method for making a patterned fiber derived from polyacrylonitrile and having a sequence of a plurality of conductive or semi-conductive segments having a predetermined conductivity and a predetermined aspect ratio separated by segments of lower conductivity, comprising the steps of:

(a) coating a continuous fiber with photoresist;

(b) exposing predetermined regions of the coated fiber to define the segments having a predetermined aspect ratio that will also have a predetermined conductivity;

(c) developing the exposed photoresist to reveal bare fiber in a revealed area; and (d) metallizing the revealed areas to produce the conductive segments having predetermined conductivity in the range of 1000–3300 mhos/m.

5. The method of claim 4 wherein metallizing involves complexing the fiber with copper in the revealed areas, the method further comprising the step of removing the remaining photoresist from the fiber to yield the patterned fiber.

6. The product obtained by the method of claim 4.

7. The product obtained by the method of claim 5.

8. A patterned polyacrylonitrile fiber having alternating segments of bare fiber having a predetermined aspect ratio and photoresist coated fiber.

9. The fiber of claim 8 wherein the bare fiber is complexed with a copper sulfide to increase its conductivity to a predetermined level.

10. The fiber of claim 9 wherein the level is in the range of 1000–3300 mhos/m.

11. A patterned polyacrylonitrile fiber having alternating segments of relatively high and relatively low electrical conductivity, the segments of relatively high electrical conductivity having metallization and being a predetermined aspect ratio.

12. The method of claim 4 wherein metallizing includes copper.

13. The method of claim 12 wherein the copper is cupric sulfate complexed with a polyacrylonitrile and converted to copper sulfide with sodium thiosulfate.

* * * * *